United States Patent [19]

Sakakibara et al.

[11] Patent Number: 5,435,826
[45] Date of Patent: Jul. 25, 1995

[54] SPUTTERING TARGET AND METHOD FOR PRODUCING SAME

[75] Inventors: Masahiko Sakakibara; Hiromi kikuchi, both of Kumagaya, Japan

[73] Assignee: Hitachi Metals, Ltd., Tokyo, Japan

[21] Appl. No.: 155,813

[22] Filed: Nov. 23, 1993

[30] Foreign Application Priority Data

Nov. 24, 1992 [JP] Japan .................. 4-336700

[51] Int. Cl.⁶ .............................. C22C 29/12
[52] U.S. Cl. ...................... 75/232; 252/518; 501/134
[58] Field of Search ............ 252/518; 75/232; 501/134; 264/56

[56] References Cited

U.S. PATENT DOCUMENTS

| | | | |
|---|---|---|---|
| 4,962,071 | 10/1990 | Bayard | 501/134 |
| 5,071,800 | 12/1991 | Iwamoto et al. | 501/126 |
| 5,094,787 | 3/1992 | Nakajima et al. | 264/65 |

FOREIGN PATENT DOCUMENTS 4160047 6/1992 Japan .
4293769 10/1992 Japan .

*Primary Examiner*—Ngoclan T. Mai

[57] ABSTRACT

A sputtering target having a relative density of 90% or more and a single-phase structure for forming a indium-tin oxide layer of low resistance is produced by pressing a composite powder of indium oxide and tin oxide having an average diameter of 0.1 $\mu$m or less and a tin content controlled to 1.5–6 weight %; and sintering the pressed composite powder at 1500°–1700° C. in an oxygen atmosphere pressurized at 1–10 atm.

5 Claims, 2 Drawing Sheets

200μm

200μm

SPUTTERING TARGET AND METHOD FOR PRODUCING SAME

BACKGROUND OF THE INVENTION

The present invention relates to a sputtering target for forming an indium-tin oxide layer as a transparent electrode for liquid crystal displays, thin-layer electroluminescence displays, etc., and a method for producing such a sputtering target.

Since an indium-tin oxide layer composed of indium oxide ($In_2O_3$) doped with tin oxide ($SnO_2$) has high transparency and electric conductivity, it is widely used for displays such as liquid crystal displays, thin-layer electroluminescence displays, etc., and conductors connected to anti-icer heaters for window glasses of air planes, etc.

Such an indium-tin oxide layer is usually formed by a sputtering method, an electron beam deposition method, a CVD method, etc. Among them, the sputtering method for forming an indium-tin oxide layer by sputtering a target constituted by a sintered body of indium oxide and tin oxide with an inert gas ion is mostly utilized because it needs a simpler apparatus than any other methods.

The sintered target was conventionally produced from a mixture of $In_2O_3$ powder and $SnO_2$ powder, but such a sintered target posed various problems. One of such problems is an abnormal discharge phenomenon during the sputtering. If this abnormal discharge phenomenon takes place, the resulting sputtered layer does not have a good uniformity, and if sputtering is continued while leaving the abnormal discharge phenomenon to occur, the sputtering surface of the target would have black spots which serve to increase a thin-film resistance of the resultant sputtered layer.

In view of this problem, it was proposed by Japanese Patent Laid-Open No. 4-160047 to provide an indium-tin oxide sputtering target consisting essentially of indium, oxygen and 3 weight % or more of tin and having a relative density of 80% or more, a tin content measured by a linear analysis with an electron probe X-ray microanalyzer (EPMA) being within the range of 0.8–1.2 times an average content thereof; the sputtering target having a surface resistance of 1 m$\Omega$/cm$^2$ or less; an integrated intensity of an X-ray diffraction peak of a (1,1,0) plane of an $SnO_2$ phase being 0.5% or less of that of a (2,2,2) plane of an $In_2O_3$ phase. This sputtering target is aimed at dissolving the above problem by reducing the amount of the $SnO_2$ phase. Incidentally, the drastic reduction of the $SnO_2$ phase can be achieved by heat-treating the oxide mixture at 1350° C. or higher, preferably 1400°–1550° C. for 10 hours or more so that the $SnO_2$ phase and the $In_2O_3$ phase fully react with each other.

Japanese Patent Laid-Open No. 4-293769 discloses a sintered indium-tin oxide target for sputtering having a relative density of 80–100%, and a grain size of 5–30 $\mu$m, at least surfaces of grains being free from $(In_{0.6}Sn_{0.4})_2O_3$. This target is aimed at forming a transparent electrode layer having a low resistance by a low-temperature sputtering, and it can be formed by sintering a molded indium-tin oxide powder at 1450°–1600° C., and heat-treating it at 1000°–1300° C. in an oxygen-containing atmosphere. In the heat treatment in an oxygen-containing atmosphere, $(In_{0.6}Sn_{0.4})_2O_3$ disappears by thermal decomposition.

In both of Japanese Patent Laid-Open Nos. 4-160047 and 4-293769, phases detrimental to indium-tin oxide sputtering targets are effectively reduced. However, both methods of these references need a heat treatment process in addition to the sintering process, making them disadvantageous in productivity and cost. Also, in the method of Japanese Patent Laid-Open No. 4-160047, the $SnO_2$ phase is reduced but the reduction of the $(In_{0.6}Sn_{0.4})_2O_3$ phase is not achieved. In the method of Japanese Patent Laid-Open No. 4-293769, the reduction of the $(In_{0.6}Sn_{0.4})_2O_3$ phase is achieved, but the $SnO_2$ phase is not reduced.

OBJECT AND SUMMARY OF THE INVENTION

Accordingly, an object of the present invention is to provide an indium-tin oxide sputtering target in which undesirable phases such as an $SnO_2$ phase and an $(In_{0.6}Sn_{0.4})_2O_3$ phase are minimized without needing a heat treatment process.

Another object of the present invention is to provide a method for producing such an indium-tin oxide sputtering target.

As a result of intense research for solving the above problems, the inventors have found that by forming and sintering a composite powder of indium oxide and tin monoxide having a smaller Sn content than those conventional starting materials, the resultant sputtering target contains no or, if any, extremely reduced amounts of undesirable phases such as $SnO_2$, $(In_{0.6}Sn_{0.4})_2O_3$, etc.

The sputtering target for forming an indiumotin oxide layer according to the present invention is constituted by a sintered body substantially composed of indium, tin and oxygen and having a single-phase structure having a relative density of 90% or more and a relative resistance of $1 \times 10^{-3}$ $\Omega$.cm or less.

The first method for producing a sputtering target for forming an indium-tin oxide layer according to the present invention comprises pressing a composite powder of indium oxide and tin oxide having an average diameter of 0.1 $\mu$m or less and a tin content controlled to 2–6 weight %; and sintering the pressed composite powder at 1500°–1700° C. in an oxygen atmosphere pressurized at 1–10 atm.

The second method for producing a sputtering target for forming an indium-tin oxide layer according to the present invention comprises mixing a composite powder of indium oxide and tin oxide having an average diameter of 0.1 $\mu$m or less and a tin content controlled to 1.5–6 weight % with indium oxide powder having an average diameter of 0.1 $\mu$m or less and/or tin oxide powder having an average diameter of 0.1 $\mu$m or less; pressing the resultant mixed powder; and sintering the pressed body at 1500°–1700° C. in an oxygen atmosphere pressurized at 1–10 atm.

DETAILED DESCRIPTION OF THE INVENTION

The present invention will be described in detail below.

[1] Sputtering target

The sputtering target for forming an indium-tin oxide layer according to the present invention is constituted by a sintered body substantially composed of indium, tin and oxygen and having a single-phase structure having a relative density of 90% or more and a relative resistance of $1 \times 10^{-3}$ Ω.cm or less.

The target of the present invention should have a single-phase structure because it makes it possible to keep a resistance variation of the sputtered layer 2% or less even after 30 hours of sputtering under the conditions of input power of 1 W/cm$^2$, a sputtering gas pressure of 1 Pa and a substrate temperature of 25° C. The term "single-phase structure" used herein means that tin exists as a dopant between In$_2$O$_3$ lattice, and that other undesirable phases than In$_2$O$_3$ phase, such as SnO$_2$ phase, etc., do not exist at all, or if any they are 10% or less, preferably 5% or less, more preferably 2% or less at an area ratio.

Figure 1:
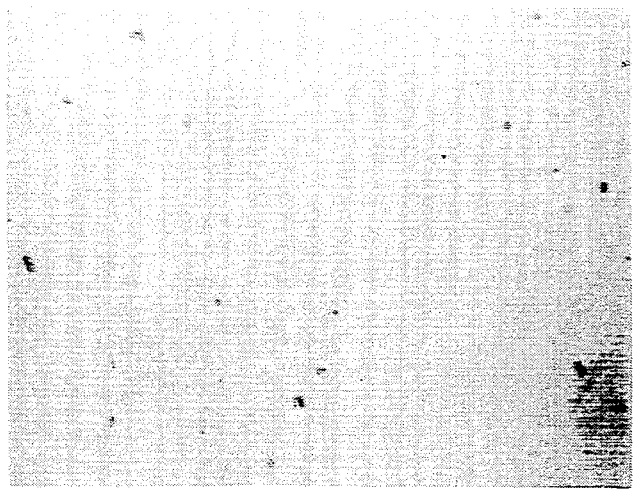
FIG. 1 is a photomicrograph ($\times 400$) taken by an optical microscope showing the microstructure of the target of Example 1.
Figure 2:
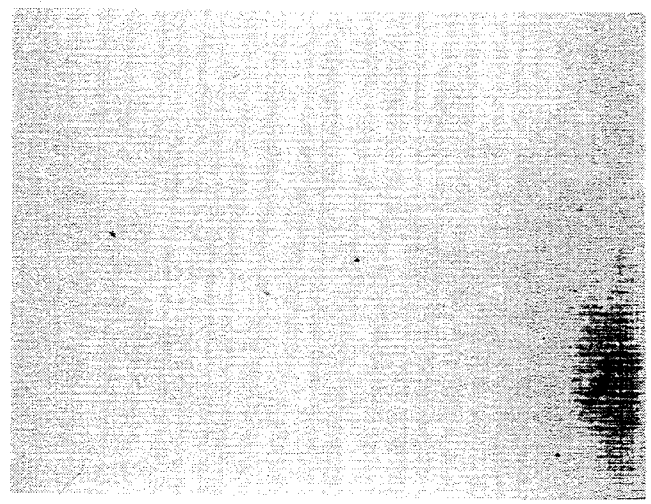
FIG. 2 is a photomicrograph ($\times 400$) taken by an optical microscope showing the microstructure of the target of Comparative Example 3.

The single-phase structure can be confirmed by an X-ray diffraction and a microstructure observation. FIG. 1 shows the microstructure of the target having a single-phase structure according to the present invention, and FIG. 2 shows the microstructure of the target having a multi-phase structure containing undesirable phases. Analysis by an electron probe X-ray microanalyzer (EPMA) identifies that the undesirable phases in FIG. 2 are In$_4$Sn$_3$O$_{12}$.

The target of the present invention should have a relative density of 90% or more, because if otherwise increase in the resistance of a thin-film layer formed by sputtering would be inevitable, thereby failing to efficiently achieve the effects of the single-phase structure on stabilization of the resistance of the resultant thin-film layer.

The target of the present invention should have a relative resistance of $1 \times 10^{-3}$ Ω.cm or less to produce an indiumtin oxide layer having a relative resistance on the level of $1 \times 10^{-4}$ Ω.cm.

[2] First method for producing sputtering target

The first method for producing a sputtering target for forming an indium-tin oxide layer comprises pressing a composite powder of indium oxide and tin oxide having an average diameter of 0.1 μm or less and a tin content controlled to 1.5–6 weight %; and sintering the pressed composite powder at 1500°–1700° C. in an oxygen atmosphere pressurized at 1–10 atm.

The term "composite powder of indium oxide and tin oxide" used herein means a single powder particle in which In, Sn and O exist. Specific examples of the composite powder of indium oxide and tin oxide include solid solution powder, co-precipitated powder, powder obtained by a vapor quenching method in which an In—Sn alloy is evaporated in an inert gas atmosphere and oxidized by blowing the air or an oxygen gas (same as in Example 1), powder obtained by a melt-spray method in which an In—Sn alloy is melted and sprayed in an oxidizing atmosphere, etc.

The first feature of this method is that the composite powder of indium oxide and tin oxide is used to form the single-phase structure in the target. If a mixture of indium oxide powder and tin oxide powder is used, a structurally uniform sintered body cannot be produced, permitting undesirable phases such as SnO$_2$ and In$_4$Sn$_3$O$_{12}$ to appear in the target structure. On the other hand, if a highly uniform composite powder of indium oxide and tin oxide is used, the resultant sintered body has a uniform structure in which undesirable phases such as SnO$_2$ and In$_4$Sn$_3$O$_{12}$ are suppressed.

The second feature of this method is that the Sn content is restricted to 1.5–6 weight %. In the conventional methods as disclosed in Japanese Patent Laid-Open Nos. 4-160047 and 4-293769, a ratio of SnO$_2$ powder to In$_2$O$_3$ powder is 10 weight %, namely the Sn content is about 8 weight %. However, the Sn content is as small as 1.5–6 weight % in the present invention.

If the Sn content is less than 1.5 weight %, a low resistance required for the indium-tin oxide layer cannot be achieved. On the other hand, if it exceeds 6 weight %, the reduction of undesirable phases such as SnO$_2$ and In$_4$Sn$_3$O$_{12}$ cannot be achieved. The preferred Sn content is 3.5–5.5 weight %.

The composite powder should have an average diameter of 0.1 μm or less, otherwise it would be difficult to produce a sintered body having a relative density of 90% or more.

The pressurized oxygen atmosphere is necessary to provide the resultant sputtering target with a high density. However, density-increasing action levels off at the oxygen atmosphere pressure of about 10 atm. Accordingly, the oxygen atmosphere pressure is restricted to 1–10 atm for economic reason. The preferred oxygen atmosphere pressure is 3–8 atm, preferably 4–6 atm.

If the sintering temperature is lower than 1500° C., a sintered body having a relative density of 90% or more cannot be obtained. On the other hand, if it exceeds 1700° C., tin oxide and indium oxide are decomposed, resulting in a lower density. Accordingly, the sintering temperature is restricted to 1500°–1700° C.

[2] Second method for producing sputtering target

Although it is preferable to use 100% a highly uniform composite powder of indium oxide and tin oxide as a starting material for the sputtering target of the present invention, the composite powder may be mixed with indium oxide powder having an average diameter of 0.1 μm or less and/or tin oxide powder having an average diameter of 0.1 μm or less.

The amount of the indium oxide powder and/or the tin oxide powder to be mixed with the composite powder should be 40 weight % or less based on the resultant mixed powder. If the amount of the indium oxide powder and/or the tin oxide powder exceeds 40 weight %, the target would have non-uniformity. Particularly, if both indium oxide powder and tin oxide powder are added, the amount of the indium oxide powder is preferably 20 weight % or less, and the amount of the tin oxide powder is preferably 20 weight % or less.

Except for the above points, the second method is the same as the first method.

The present invention will be explained in further detail by way of the following Examples, without intending to restrict the scope of the present invention.

EXAMPLES 1–7, COMPARATIVE EXAMPLES 1–6

Indium-tin alloys having various compositions were evaporated in a nitrogen gas atmosphere and oxidized by blowing an oxygen gas to produce various composite powders of indium oxide and tin oxide. Each of these composite powders was classified to provide powder having an average diameter shown in Table 1. By the same dry method as described above, each of indium oxide powder and tin oxide powder having an average diameter shown in Table 1 was produced from indium and tin. When necessary, these powders were mixed at predetermined ratios by a ball mill for 24 hours. In the case of the composite powder alone, 1% of polyvinyl alcohol (PVA) was added to the composite powder and subjected to cold pressing at 3000 kg/cm$^2$. The resultant green body was sintered at 1600° C. in a pressurized oxygen atmosphere at 5 atm for 6 hours.

COMPARATIVE EXAMPLE 7

According to Example 1 of Japanese Patent Laid-Open No. 4-160047, In$_2$O$_3$ powder having an average diameter of 0.07 μm was added to SnO$_2$ powder having an average diameter of 0.5 μm such that SnO$_2$ was 10 weight % and mixed for 48 hours in a ball mill to produce a mixed powder having an average diameter of 0.05 μm.

After drying, this mixed powder was heated at 1450° C. for 30 hours, introduced into a ball mill again to carry out pulverization for 24 hours. The pulverized powder had an average diameter of 0.8 μm.

This powder was dried, granulated and then sintered in a vacuum hot-pressing apparatus under the conditions of a sintering temperature of 800° C., a vacuum degree of 0.01 Torr, a pressure of 400 kg/cm$^2$ and a sintering time of 3 hours.

COMPARATIVE EXAMPLE 8

According to Example 1 of Japanese Patent Laid-Open No. 4-293769, indium oxide powder having an average diameter of 0.07 μm was mixed with 10 weight % of tin oxide powder having an average diameter of 0.1 μm, and pressed in a die. The pressed body was sintered at 1520° C. for 5 hours and then subjected to a heat treatment at 1300° C. for 10 hours in the air. The resultant sintered body was machined to provide a target of 100 mm in diameter and 5 mm in thickness.

Each target was mirror-polished and observed by an optical microscope with respect to a microstructure at the center of a sputtering surface. The results of microstructure observation are shown in Table 1. Also, the photomicrographs of the microstructures of the targets of Example 1 and Comparative Example 3 are shown in FIGS. 1 and 2, respectively. FIGS. 1 and 2 indicate that the target of Example 1 has a single-phase structure, while the target of Comparative Example 3 has a multi-phase structure containing undesirable phases of In$_4$Sn$_3$O$_{12}$. Incidentally, in FIGS. 1 and 2, black spots are pores, and blight regions are undesirable phases of In$_4$Sn$_3$O$_{12}$.

As is clear from Table 1, the target of Comparative Example 1 produced from a starting composite powder having an average diameter exceeding 0.1 μm has a relative density of less than 90%. Also, the target of Comparative Example 3 containing 10 weight % of tin has a multi-phase structure, and the target of Comparative Example 2 produced from a mixed powder of indium oxide and tin oxide also has a multi-phase structure. Further, in the target of Comparative Example 4 containing 1 weight % of tin, the target itself shows a high relative resistance.

The target of Comparative Example 7 has a multi-phase structure containing a small amount of an SnO$_2$ phase and a large amount of an In$_4$Sn$_3$O$_{12}$ phase. The target of Comparative Example 8 has a multi-phase structure containing a small amount of an In$_4$Sn$_3$O$_{12}$ phase and a large amount of an SnO$_2$ phase.

TABLE 1

| | Starting Materials | | | | | |
|---|---|---|---|---|---|---|
| | Powder Composition (wt. %) | | | Average Diameter (μm) | | |
| No. | Composite Powder | In$_2$O$_3$ | SnO$_2$ | Composite Powder | In$_2$O$_3$ | SnO$_2$ |
| Example | | | | | | |
| 1 | 100 | 0 | 0 | 0.07 | — | — |
| 2 | 100 | 0 | 0 | 0.08 | — | — |
| 3 | 90 | 10 | 0 | 0.07 | 0.08 | — |
| 4 | 80 | 20 | 0 | 0.07 | 0.08 | — |
| 5 | 70 | 30 | 0 | 0.07 | 0.08 | — |
| 6 | 80 | 0 | 20 | 0.07 | — | 0.1 |
| 7 | 100 | 0 | 0 | 0.07 | — | — |
| Comparative Example | | | | | | |
| 1 | 100 | 0 | 0 | 0.20 | — | — |
| 2 | 0 | 95 | 5 | — | 0.08 | 0.1 |
| 3 | 100 | 0 | 0 | 0.07 | — | — |
| 4 | 50 | 50 | 0 | 0.07 | 0.08 | — |
| 5 | 100 | 0 | 0 | 0.08 | — | — |
| 6 | 100 | 0 | 0 | 0.07 | — | — |
| 7 | 0 | 90 | 10 | — | 0.07 | 0.5 |
| 8 | 0 | 90 | 10 | — | 0.07 | 0.1 |

| | Target Properties | | | | |
|---|---|---|---|---|---|
| No. | Tin Content (wt. %) | Relative Density (%) | Phase Structure | Area Ratio of Undesirable Phases (%) | Relative Resistance (μΩ · cm) |
| Example | | | | | |
| 1 | 4 | 98 | Single phase | 2 | 410 |
| 2 | 2 | 98.5 | Single phase | 0 | 205 |
| 3 | 4 | 97 | Single phase | 4 | 507 |
| 4 | 3 | 98 | Single phase | 4 | 304 |
| 5 | 2 | 97 | Single phase | 3 | 315 |
| 6 | 5 | 97 | Single phase | 5 | 513 |
| 7 | 6 | 98 | Single phase | 8 | 510 |
| Comparative Example | | | | | |
| 1 | 4 | 87 | Single phase | 5 | 602 |
| 2 | 4 | 97 | Multi phase | 15 | 523 |
| 3 | 10 | 98 | Multi phase | 20 | 515 |
| 4 | 1.0 | 98 | Single phase | 0 | 6020 |
| 5 | 7 | 97 | Multi phase | 13 | 512 |
| 6 | 8 | 98 | Multi phase | 18 | 514 |
| 7 | 8 | 95 | Multi phase | 12 | 570 |
| 8 | 8 | 87 | Multi phase | 13 | 623 |

Using each of the above targets, sputtering was conducted under the following conditions:
Sputtering power: 1.0 W/cm$^2$,
Sputtering gas composition: 99% argon+1% oxygen,
Sputtering gas pressure: 1 Pa, and
Substrate temperature: 25° C.

After 2 hours of sputtering, the resistance of a sputtered layer was measured. This resistance was called initial resistance (a). After 30 hours of sputtering, the substrate was exchanged and sputtering was continued on a new substrate. The resistance of a sputtered layer formed on the new substrate was called after-30-hour resistance (b). Each resistance (a), (b) is shown in Table 2.

TABLE 2

| No. | Resistance ($\mu\Omega \cdot$ cm) (a) | (b) | Change Ratio of Resistance* (%) |
|---|---|---|---|
| Example | | | |
| 1 | 170 | 173 | 1.8 |
| 2 | 212 | 215 | 1.4 |
| 3 | 191 | 194 | 1.6 |
| 4 | 213 | 217 | 1.9 |
| 5 | 225 | 229 | 1.8 |
| 6 | 204 | 207 | 1.5 |
| 7 | 253 | 257 | 1.6 |
| Comparative Example | | | |
| 1 | 187 | 230 | 23.0 |
| 2 | 304 | 352 | 15.7 |
| 3 | 406 | 491 | 20.9 |
| 4 | 7020 | 7139 | 1.7 |
| 5 | 295 | 316 | 7.1 |
| 6 | 304 | 347 | 14.1 |
| 7 | 413 | 456 | 10.4 |
| 8 | 536 | 597 | 11.4 |

Note: *(b − a)/a × 100.

As is shown in Table 2, the targets of the present invention (Examples 1–7) can extremely stably produce sputtered thin-film indium-tin oxide layers of low resistance which varies only less than 2% even after 30 hours of sputtering. On the other hand, the target of Comparative Example 4 produces a sputtered layer having a high initial resistance, and the targets of Comparative Examples 1–3 produce sputtered layers having after-30-hour resistances more than 15% higher than the initial resistances thereof. This means that the targets of Comparative Examples 1–4 cannot be used for sputtering for a long period of time.

Observation of the sputtering surfaces of the targets after 30 hours of sputtering revealed that the targets of Comparative Examples 1 and 3 have been discolored to extremely black as compared with those of the present invention (Examples 1–7).

Figure 3:
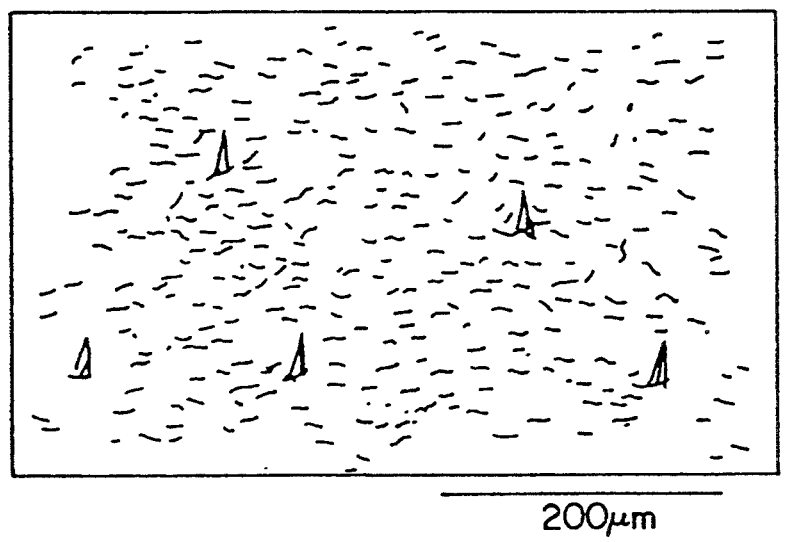
FIG. 3 is a schematic view of a scanning-type electron photomicrograph ($\times 200$) showing a sputtering surface of the target of Example 1 after sputtering.
Figure 4:
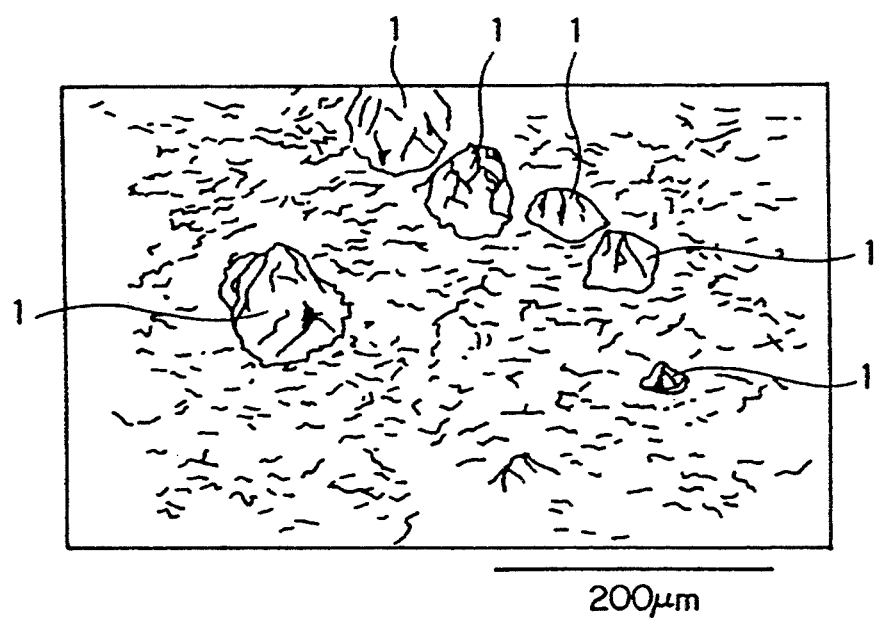
FIG. 4 is a schematic view of a scanning-type electron photomicrograph ($\times 200$) showing a sputtering surface of the target of Comparative Example 2 after sputtering.

With respect to the target of the present invention (Example 1) and the target of Comparative Example 2, their sputtering surfaces after 30 hours of sputtering were observed by a scanning-type electron microscope from a direction of 45°. The results are shown in FIGS. 3 and 4. As is clear from the comparison of FIGS. 3 and 4, the target of Comparative Example 2 has a sputtering surface having many large conical projections 1 (FIG. 4), while the target of Example 1 has a sputtering surface having only small projections (FIG. 3).

EPMA observation of these projections revealed that tin atoms are concentrated in their tip portions, and that an oxygen concentration is lower in their tip portions than in other portions of the targets. From these results, it has been found that as the target has a multi-phase structure, undesirable phases in the form of projections grow on their sputtering surfaces with oxygen concentration decreased in tip portions of the projections, thereby causing an increase in relative resistance of the resultant indium-tin oxide layer.

EXAMPLES 8–11, COMPARATIVE EXAMPLES 9–10

A composite powder of indium oxide and tin oxide having a tin content of 4 weight % produced in the same manner as in Example 1 was used to produce targets under the same conditions as in Example 1 except that the final sintering temperature was changed from 1450° to 1650° C. and that as a sintering atmosphere, pressurized oxygen at 5 atm or the air was used.

Sputtering was conducted with these targets in the same manner as in Example 1 to produce sputtered indium-tin oxide layers, and the resistances of the indium-tin oxide layers were measured. The results are shown in Table 3.

TABLE 3

| No. | Tin Content (weight %) | Sintering Temperature (°C.) | Sintering Atmosphere |
|---|---|---|---|
| Example | | | |
| 8* | 4 | 1600 | 5-atm Oxygen |
| 9 | 4 | 1550 | 5-atm Oxygen |
| 10 | 4 | 1500 | 5-atm Oxygen |
| 11 | 4 | 1650 | 5-atm Oxygen |
| Comparative Example | | | |
| 9 | 4 | 1450 | 5-atm Oxygen |
| 10 | 4 | 1600 | Air |

Note: *The same as Example 1.

| No. | Relative Density (%) | Resistance of Layer ($\mu\Omega \cdot$ cm) (a) | (b) | Change Ratio of Resistance* (%) |
|---|---|---|---|---|
| Example | | | | |
| 8** | 98 | 170 | 173 | 1.8 |
| 9 | 97 | 182 | 185 | 1.6 |
| 10 | 93 | 178 | 181 | 1.7 |
| 11 | 98 | 175 | 178 | 1.7 |
| Comparative Example | | | | |
| 9 | 87 | 294 | 344 | 17.0 |
| 10 | 80 | 367 | 492 | 34.1 |

Note:
*(b − a)/a × 100.
**The same as Example 1.

As is clear from Table 3, since the target of Comparative Example 9 produced at a low sintering temperature has as low a relative density as 87%, the resultant indium-tin oxide layer shows a large change ratio of resistance. The target of Comparative Example 10 produced in the air has as low a relative density as 80%, though it was sintered at as high a temperature as 1600° C. As a result, the indium-tin oxide layer produced in Comparative Example 10 shows an extremely large change ratio of resistance. The above results show that when the relative density is as high as 90% or more, indium-tin oxide layers having low resistance can stably be produced.

Since the sputtering target of the present invention has a relative density of 90% or more and a single-phase structure, a sputtering surface of the target is hardly formed with projections during the sputtering operation, thereby stably forming indium-tin oxide layers having low resistance. This makes the target have a longer service life, resulting in a drastic reduction of such working as removal of undesirable phases from a sputtering surface of the target.

What is claimed is:
1. A sputtering target for forming an indium-tin oxide layer, comprising a sintered body substantially com- posed of indium, tin and oxygen, and a single-phase structure, wherein a relative density of said target is 93% or more, a relative resistance of said target is $1 \times 10^{-3}$ Ω.cm or less, and the tin content in said target is 1.5–6 weight %.

2. The sputtering target according to claim 1, wherein said tin exists as a dopant between an $In_2O_3$ lattice.

3. The sputtering target according to claim 1, wherein said sintered body contains a phase other than an $In_2O_3$ phase in a proportion of 10% or less at an area ratio.

4. The sputtering target according to claim 1, wherein said sintered body is produced by pressing a composite powder of indium oxide and tin oxide having an average diameter of 0.1 μm or less and a tin content controlled to 1.5–6 weight %; and sintering said pressed composite powder at 1500°–1700° C. in an oxygen atmosphere pressurized at 3–8 atm.

5. The sputtering target according to claim 1, wherein said sintered body is produced by mixing a composite powder of indium oxide and tin oxide having an average diameter of 0.1 μm and a tin content controlled to 1.5–6 weight % with at least one of indium oxide powder having an average diameter of 0.1 μm or less and tin oxide powder having an average diameter of 0.1 μm or less;

pressing said resultant mixed powder; and sintering said pressed body at 1500°–1700° C. in an oxygen atmosphere pressurized at 3–8 atm.

* * * * *